(12) United States Patent
Rajaee et al.

(10) Patent No.: US 12,438,552 B2
(45) Date of Patent: Oct. 7, 2025

(54) ΔΣMODULATION UTILIZING CONTINUOUS-TIME INPUT AND DISCRETE-TIME LOOP FILTER

(71) Applicant: Microchip Technology Incorporated, Chandler, AZ (US)

(72) Inventors: Omid Rajaee, San Diego, CA (US); Rahim Bagheri, Poway, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 241 days.

(21) Appl. No.: 18/320,774

(22) Filed: May 19, 2023

(65) Prior Publication Data

US 2023/0378974 A1 Nov. 23, 2023

Related U.S. Application Data

(60) Provisional application No. 63/365,076, filed on May 20, 2022.

(51) Int. Cl.
H03M 3/00 (2006.01)
(52) U.S. Cl.
CPC ........... H03M 3/422 (2013.01); H03M 3/368 (2013.01)
(58) Field of Classification Search
CPC ...... H03M 3/422; H03M 3/368; H03M 3/344; H03M 3/454
USPC .................................................. 341/143, 155
See application file for complete search history.

(56) References Cited

U.S. PATENT DOCUMENTS

| 7,944,378 B1 | 5/2011 | Pesenti |
| 10,784,891 B2 | 9/2020 | Rajaee et al. |
| 2019/0363730 A1* | 11/2019 | Erol ................... H03M 1/0665 |
| 2021/0126648 A1* | 4/2021 | Zhang ................ H03M 1/1061 |

OTHER PUBLICATIONS

International Search Report for International Application No. PCT/US2023/067247, mailed Sep. 27, 2023, 6 pages.
International Written Opinion for International Application No. PCT/US2023/067247, mailed Sep. 27, 2023, 8 pages.
K. Nguyen et al., A 106-dB hybrid oversampling analog-to-digital converter for digital audio, IEEE Journal of Solid-State Circuits, vol. 40, No. 12, Dec. 1, 2005, pp. 2408-2415.
S. Presenti et al., A Low-Power Strategy for Delta-Sigma Modulators, Mixed Design of Integrated Circuits and Systems, 2007, MIXDES '07 14th International Conference, IEEE, Jun. 1, 2007, pp. 203-208.

* cited by examiner

*Primary Examiner* — Jean B Jeanglaude
(74) *Attorney, Agent, or Firm* — TraskBritt

(57) ABSTRACT

Delta-sigma modulation utilizing continuous-time input and discrete-time loop filter. An apparatus includes an input circuit, a switched-capacitor, an integrator, a quantizer and a feedback loop. The input circuit receives an analog signal and produce an analog input signal, the input circuit comprising a resistor-capacitor (RC) integrator. The switched-capacitor samples the analog input signal and produce a discrete-time, sampled input signal. The integrator processes the discrete-time, sampled input signal. The quantizer converts an output of the integrator to a digital signal. The feedback loop provides the digital signal to respective inputs of the RC integrator and the integrator.

16 Claims, 16 Drawing Sheets

ΔΣ MODULATION UTILIZING CONTINUOUS-TIME INPUT AND DISCRETE-TIME LOOP FILTER

CROSS-REFERENCE TO RELATED APPLICATIONS

This application claims the benefit under 35 U.S.C. § 119(e) of the priority date of U.S. Provisional Patent Application Ser. No. 63/365,076 filed May 20, 2022, for Delta-Sigma ADC with Discrete Time Noise Function and Continuous Time Signal Transfer Function, the contents and disclosure of which is incorporated herein in its entirety by this reference.

FIELD

One or more examples relate to delta-sigma modulation. One or more examples relate to analog-to-digital conversion utilizing delta-sigma modulation.

BACKGROUND

A delta-sigma modulation (ΔΣ; or sigma-delta, ΣΔ) is a technique for encoding an analog signal into a digital signal, as found in an analog-to-digital converter (ADC). Delta-sigma modulation uses a delta-sigma modulator (DSM) to sample and quantize an input signal and to filter quantization noise. DSMs are utilized in a variety of operational contexts.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
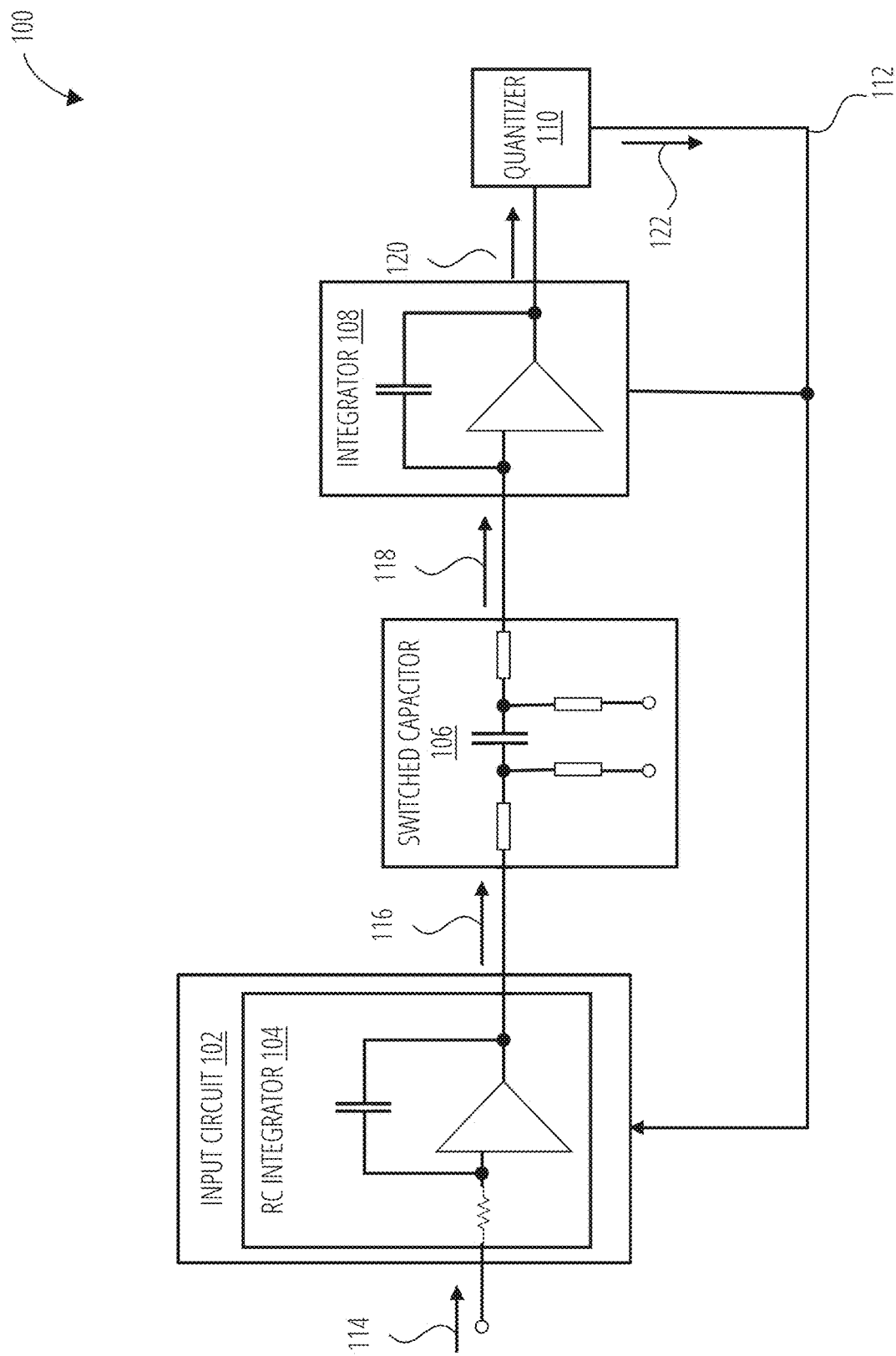
FIG. 1 is a block diagram depicting an apparatus for performing a delta-sigma modulation to convert an analog signal to a digital signal, in accordance with one or more examples.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In this description, the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The terms "on" and "connected" may be used in this description interchangeably with the term "coupled," and have the same meaning unless expressly indicated otherwise or the context would indicate otherwise to a person having ordinary skill in the art.

A typical DSM includes a quantizer and a feedback loop between the output and input of the quantizer that includes a digital filter. The quantizer generates a quantized signal intended to be a digital signal representative of the analog input signal to the DSM (the "DSM input signal"). A feedback loop provides the quantized signal to the digital filter. The digital filter processes the quantized signal and generates an error signal that represents the difference between the DSM input signal and the quantized signal. The feedback loop provides the error signal to the input of the quantizer. The DSM, via the feedback loop, iteratively reduces the error between the input signal and the quantized output signal. In the case of an delta-sigma analog-to-digital-converter (ADC), the delta-sigma ADC reduces the error until the quantized output signal suitably represents the input signal in digital form.

DSM outputs are utilized, as non-limiting examples, in wireless communication, audio or video signal processing, and measurement and control systems. The definition of high- or low-frequency-bands, thresholds for suitable noise reduction, thresholds for suitable anti-aliasing, and other relevant requirements at least partially depends, as non-limiting examples, on specific applications and operating conditions.

The DSM typically oversamples the analog input signal at a much higher rate than the Nyquist rate. The Nyquist rate is the minimum sampling rate to avoid aliasing. Aliasing is a phenomenon in which high-frequency components of a signal are incorrectly represented as lower-frequency components in the sampled signal. Oversampling allows the DSM to capture high-frequency components of the input signal, which can be filtered out by the digital filter.

The digital filter of the DSM filters out noise in the high-frequency bands (i.e., low-pass filters) of the analog input signal. The digital filter may be selected that operates in the continuous-time domain or one that operates in the discrete-time domain. When a digital filter operates on a continuous-time signal it produces a continuous-time signal which can be oversampled at the input of the quantizer. When the input signal is oversampled at the input of the quantizer, any aliasing that occurs due to the oversampling process only affects the quantization noise, which is typically at higher frequencies than the input signal. Further, by oversampling at the input of the quantizer, high-frequency noise can be filtered out more effectively by the digital filter.

When a digital filter, especially one implemented in an integrated circuit, operates on continuous-time signals the noise-transfer-function (NTF) of the digital filter is sensitive to process voltage temperature (PVT) variations. The performance of the digital filter that operates on continuous-time signals depends on the values of resistors, capacitors, and transistors, which can vary significantly due to PVT variations. So, PVT variations may affect the performance or accuracy of such a digital filter resulting in output signal that includes errors or is unpredictable.

When the digital filter operates on a discrete-time signal, oversampling can occur at the input of the quantizer, and also typically occurs at or before the input of the digital filter or subsequent to the digital filter. When oversampling occurs at or before the input of the digital filter, aliasing that occurs due to the oversampling process affects both the input signal and the quantization noise, potentially distorting the input signal and increasing the noise floor. Further, effects of aliasing due to oversampling may occur at frequency bands that are too high for the digital filter to effectively filter out.

When a digital filter, including one implemented in an integrated circuit, operates on discrete-time signals the NTF of the digital filter is less sensitive to PVT variations than the digital filter that operates on continuous-time signals, because the NTF of the digital filter is not (not or negligibly) sensitive to PVT variations. It is less sensitive to PVT variations because the sampling instant of a discrete-time signal is fixed and determined by a sampling clock, which is less affected by PVT variations. Further, a digital filter that operates on discrete-time signals can include noise shaping and dynamic element matching (DEM) to reduce the effect of PVT variations on filter performance.

One or more examples relate to, generally, a DSM topology that includes a continuous-time signal-transfer function (STF) and a discrete-time noise-transfer-function (NTF). An input circuit, including RC integration, processes an analog signal, in continuous time, into an analog input signal before the analog input signal is sampled, integrated, and quantized. A feedback loop adjusts the behavior of the loop filter. The first integrator block (RC integrator) and a switched capacitor (for sampling) provide low-pass filtering of the analog input signal, and the first and second integrator block and feedback loop provide high-pass filtering for quantization noise.

"Effective oversampling" is different than "oversampling." Oversampling involves periodically sampling a signal at a rate that is higher than the Nyquist rate—stated another way, at a rate higher than the minimum rate required to represent the signal without aliasing. Effective oversampling involves processing a signal in a manner that results in similar effects to oversampling—e.g., noise shaping to push quantization noise into higher frequency bands that can be filtered, without limitation—without actually oversampling the signal, and without the undesirable aliasing effects of oversampling discussed, above.

Reducing the impact of quantization noise on the DSM output signal improves the resolution and accuracy of the DSM.

FIG. 1 is a block diagram depicting an apparatus 100 performing a delta-sigma modulation to convert an analog signal to a digital signal, in accordance with one or more examples. Apparatus 100 may be a DSM or portion thereof, and so may also be referred to as a DSM 100 or DSM portion 100.

Apparatus 100 includes an input circuit 102, an RC integrator 104, a switched capacitor 106, an integrator 108, a quantizer 110, and a feedback loop 112.

By way of a general description of a contemplated operation of apparatus 100:

Input circuit 102 receives and processes analog signal 114 (an analog voltage signal) and generates analog input signal 116 (also an analog voltage signal).

The processing by input circuit 102 includes continuous-time active filtering of analog signal 114. The continuous-time active filtering noise-shapes and first order sinc-filters the analog signal 114 before it is sampled. The noise shaping spreads out noise over a wider frequency range, effectively shaping the noise spectrum to push it towards higher frequencies where it may be filtered out by the loop filter apparatus 100. The first order sinc filtering at apparatus 100 prevents high-frequency noise of the input signal from aliasing when sampled at a sampling rate that is lower than the Nyquist rate.

Switched capacitor 106 samples the continuous-time analog input signal 116 and generates a discrete-time, sampled input signal 118. The discrete-time, sampled input signal 118 is an analog voltage signal. The discrete-time, sampled input signal 118 is a sequence of samples taken from continuous-time analog input signal 116 at predetermined time intervals. Respective samples represent a specific sampling time interval, and an analog voltage signal at the output of switched capacitor 106 represents the portion of the continuous-time analog input signal 116 at the specific sampling time interval represented by the sample. The duration of a sampling time interval is set by a switching frequency of switched capacitor 106, and the switching frequency is set by the frequency of one or more clock signals provided to switched capacitor 106 (clock signals not depicted).

Integrator 108 processes discrete-time, sampled input signal 118. More specifically, integrator 108 holds (e.g., temporarily stores, without limitation) a previous sample discrete-time, sampled input signal 118 and integrates the summation of the previous sample of discrete-time, sampled input signal 118 and a current sample of discrete-time, sampled input signal 118 to amplify respective samples of discrete-time, sampled input signal 118.

Quantizer 110 converts the output of integrator 108, amplified discrete-time, sampled input signal 120, to a digital signal by mapping the amplified discrete-time, sampled input signal 120 to a set of discrete voltage levels. Feedback loop 112 provides the output signal back to respective inputs of input circuit 102 and integrator 108 as feedback signal 122. The digital signal, and feedback signal 122, typically includes quantization noise (also called "quantization error"), and the loop filter implemented by feedback loop 112 reduces the quantization noise until the digital signal adequately represents the analog signal.

The signal-transfer-function (STF) of apparatus 100 generally corresponds to resistor and capacitor values in the input circuit 102, which is referred to herein as being "continuous-time signal-transfer-function" or "CT-STF." The noise-transfer-function (NTF) of apparatus 100 is defined by capacitance ratios (discussed below), which is referred to herein as being a "discrete-time noise-transfer-function" or "DT-NTF."

Figure 2:
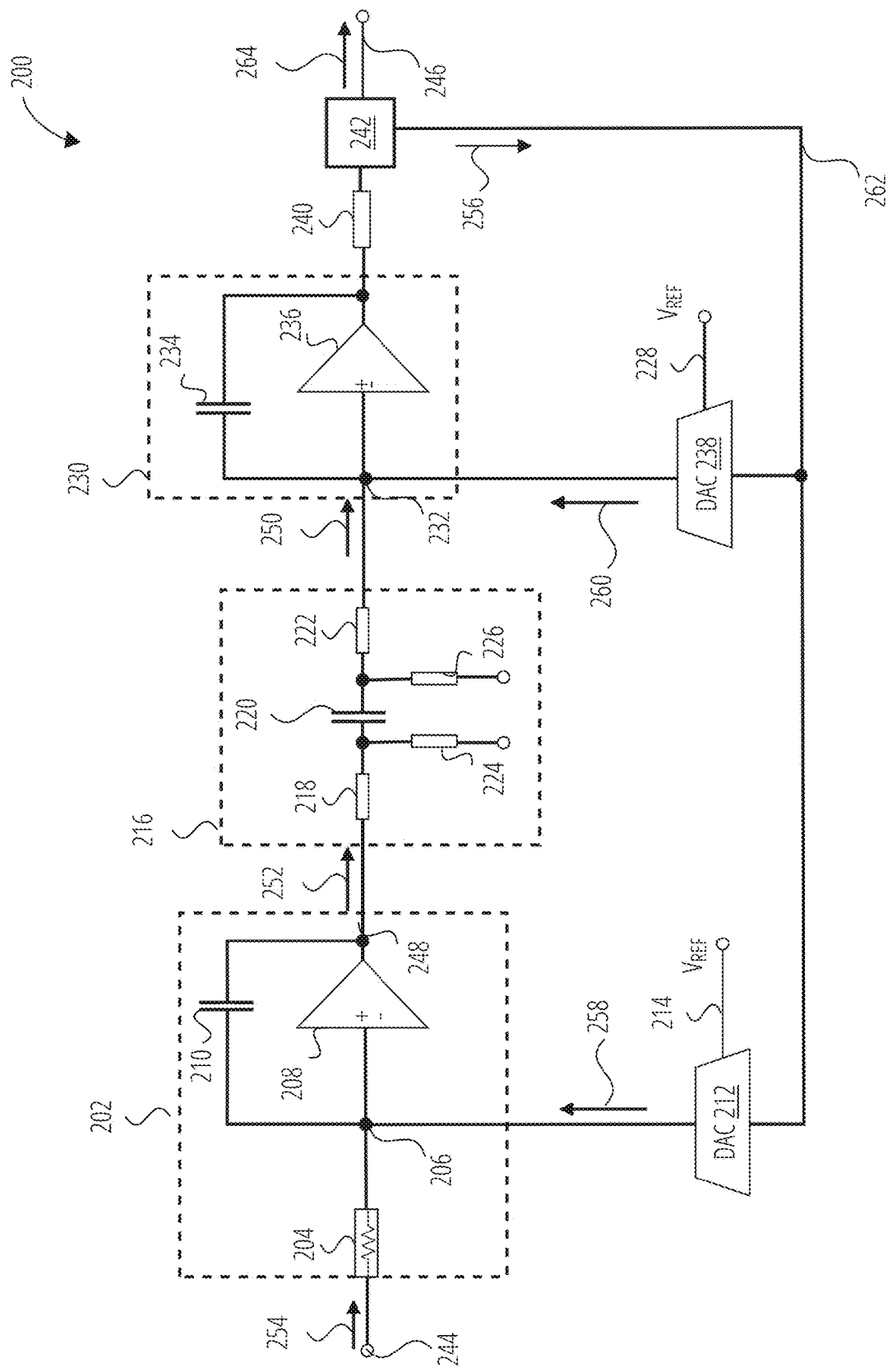
FIG. 2 is a schematic diagram depicting an apparatus to convert an analog voltage signal to a digital voltage signal, in accordance with one or more examples.

FIG. 2 is a schematic diagram depicting an apparatus 200 to convert an analog voltage signal to a digital voltage signal, in accordance with one or more examples. Apparatus 200 may also be referred to herein as a "delta-sigma modulator 200" or "DSM 200."

As depicted in FIG. 2, DSM 200 includes: input circuit 202, switched capacitor 216, integrator 230, sampling switch 240 and quantizer 242. Input circuit 202 includes resistor 204, current summing node 206, op-amp 208, and capacitor 210. Switched capacitor 216 includes switch 218, capacitor 220, switch 222, switch 224, and switch 226. Integrator 230 includes current summing node 232, capacitor 234, and op-amp 236. Feedback loop 262 includes DAC 212 and DAC 238 with respective reference inputs 214 and 228 coupled to receive a reference voltage Vref.

Generally speaking, input circuit 202 processes the analog signal 114 to attenuate and filter analog signal 114 before it is sampled. Here, input circuit 202 receives analog signal 254 and digital feedback signal 256, and generates analog input signal 252. Analog signal 254 is an analog voltage signal applied to DSM input 244 (which may also be referred to herein as a "first terminal 244"). Digital feedback signal 256 is a digital voltage signal that is indicative of (e.g., proportional to or the same as, without limitation) a digital signal output by DSM 200 and more specifically, output by quantizer 242.

A differential input ("+−") of op-amp 208 is coupled to a ground connection of current summing node 206. Resistor 204 couples DSM input 244 to an input of current summing node 206. DAC 212 couples quantizer 242 to an input of current summing node 206. Capacitor 210 couples an output 248 of op-amp 208 to an output of current summing node 206.

When analog signal 114, which is a voltage signal, is applied to DSM input 244, it is applied across resistor 204, which produces a corresponding current signal. This corresponding current signal is summed with the current of analog feedback signal 258 at current summing node 206 and a resulting current is applied to capacitor 210. Capacitor 210 is charged or discharged, over a time interval, by current flowing through it. The voltage generated by capacitor 210 in response to the resulting current is proportional to the integral of the resulting current over the time interval. In other words, the output voltage is equal to the integrated charge on capacitor 210, which is proportional to the integral of analog signal 254. The output of input circuit 202 is taken from the voltage across capacitor 210.

Op-amp 208 has a high input impedance and the amount of any resulting current flowing into the differential input of op-amp 208 is negligible, so the input of op-amp 208 may operate as a virtual ground source for current summing node 206.

Input circuit 202 effectively oversamples analog signal 254. Effective oversampling reduces the risk of aliasing and pushes noise into high-frequency bands, including high-frequency bands attenuated by op-amp 208 and capacitor 210, which operate as an active low-pass filter on the analog signal.

The signal-transfer-function (STF) of DSM 200 generally corresponds to input circuit 202, and depends on the respective values of resistor 204 and capacitor 210, and so the STF of DSM 200 is CT-STF.

Switched capacitor 216 samples the analog input signal and generates a discrete-time, sampled analog input signal 250 ("discrete-time, sampled input signal 250"). As discussed above, discrete-time, sampled input signal 250 is a sequence of samples taken from the continuous-time analog input signal 252 at predetermined time intervals. A respective sample represents a specific sampling time interval, and a voltage signal at an output of switched capacitor 216 represents a portion of analog input signal 252 corresponding to the specific sampling time interval represented by the respective sample. The voltage across capacitor 220 over the sampling time interval is proportional to the voltage potential of analog input signal 252 for the sampling time interval. The duration of a sampling time interval is set by a switching frequency of switched capacitor 106, and more specifically, switch 218, switch 222, switch 224, and switch 226. The switching frequency of switches 218, 222, 224 and 226 is controlled by clock signals (not depicted). Both the AC and DC voltage across capacitor 220 is sampled.

Integrator 230 processes discrete-time, sampled input signal 250 to amplify discrete-time, sampled input signal 250 as discussed below. Integrator 230 receives discrete-time, sampled input signal 250 and analog feedback signal 260 and generates an amplified discrete-time, sampled input signal 250. The differential input of op-amp 236 is coupled to current summing node 232.

An input of current summing node 232 is coupled to an output of switched capacitor 216. DAC 238 couples an output (or feedback output) of quantizer 242 to an input of current summing node 206. Capacitor 234 couples a differential output of op-amp 236 to an output of current summing node 206.

The noise-transfer-function NTF of apparatus DSM 200 generally corresponds to the ratio of the capacitances of capacitor 234 and capacitor 220, which are set by coefficients, and so are DT-NTF.

Capacitor 234 integrates the summation of a previous sample of discrete-time, sampled input signal 250 and a current sample of discrete-time, sampled input signal 250 to amplify discrete-time, sampled input signal 250.

Quantizer 242 maps a continuous range of voltages samples of discrete-time, sampled input signal 250 to a set of discrete voltage levels. Here, quantizer 242 receives the amplified version of discrete-time, sampled input signal 250 and maps it to a set of discrete voltage levels, which quantizer 242 uses to generate a high-resolution digital output signal 264 provided to DSM output 246 (which may also be referred to herein as a "second terminal 246"). Digital feedback signal 256 is fed back to input circuit 202 and integrator 230 via feedback loop 262. Digital feedback signal 256 may be the same or indicative of digital output signal 264 (e.g., proportional to, without limitation).

Figure 3:
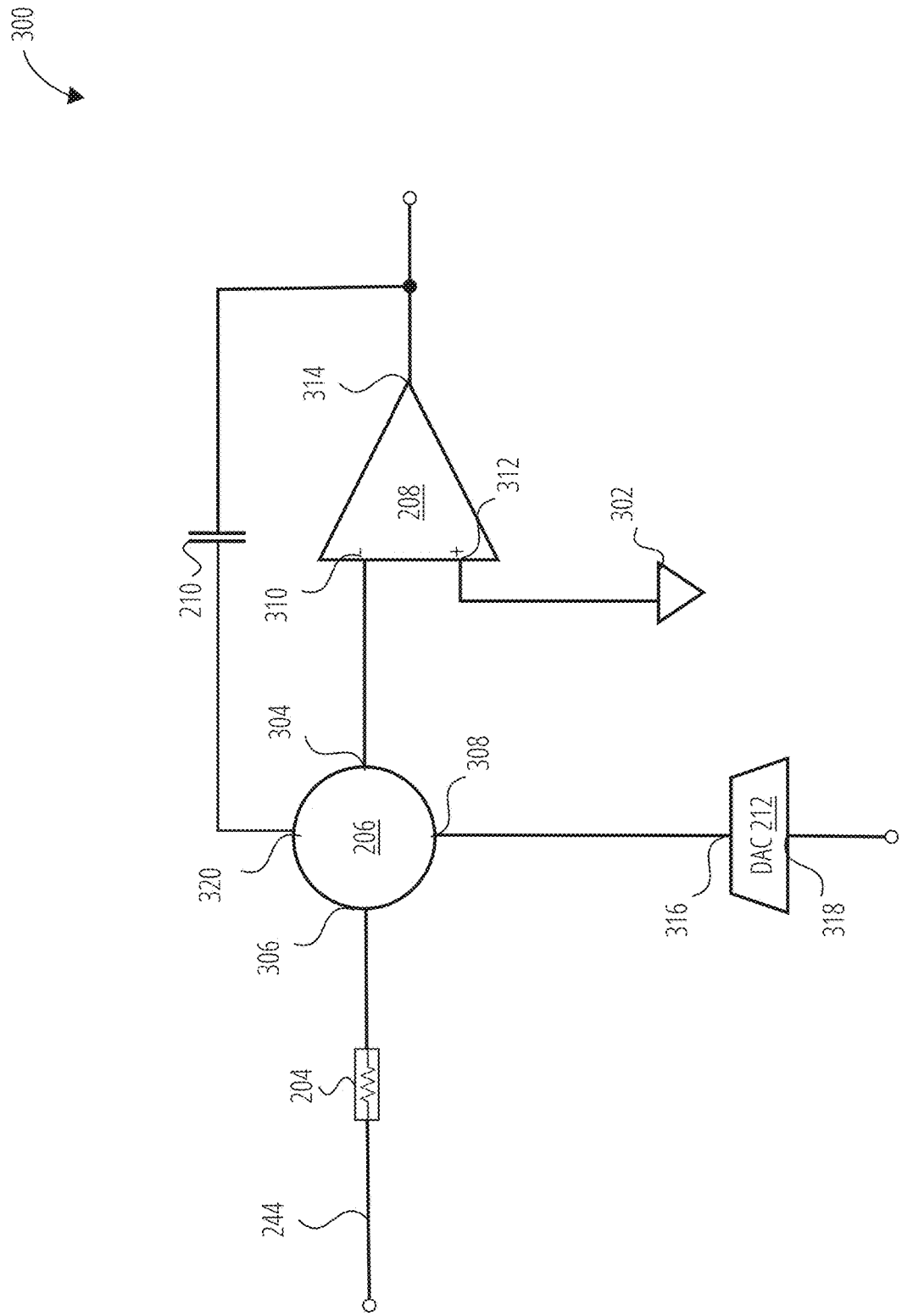
FIG. 3 is a schematic diagram depicting an input circuit that is an example of an input circuit of FIG. 2 or input circuit of FIG. 1.

FIG. 3 is a schematic diagram depicting an input circuit 300 that is an example of an input circuit 202 of FIG. 2 or input circuit 102 of FIG. 1.

Depicted are resistor 204, current summing node 206, op-amp 208, capacitor 210, DAC 212, and DSM input 244.

An input 318 of DAC 212 is coupled to receive a digital feedback signal. A second input 308 of current summing node 206 is coupled to an output 316 of DAC 212. A first input 306 of current summing node 206 is coupled to DSM input 244 via resistor 204. A virtual ground input 304 of current summing node 206 is coupled to an inverting input 310 of op-amp 208. A non-inverting input 312 of op-amp 208 is coupled to ground 302. An output 314 of op-amp 208 is coupled to output 320 of current summing node 206 via capacitor 210. Other connections to inverting/non-inverting inputs 310 and 312 may be utilized to provide virtual ground without exceeding the scope of this disclosure.

Figure 4:
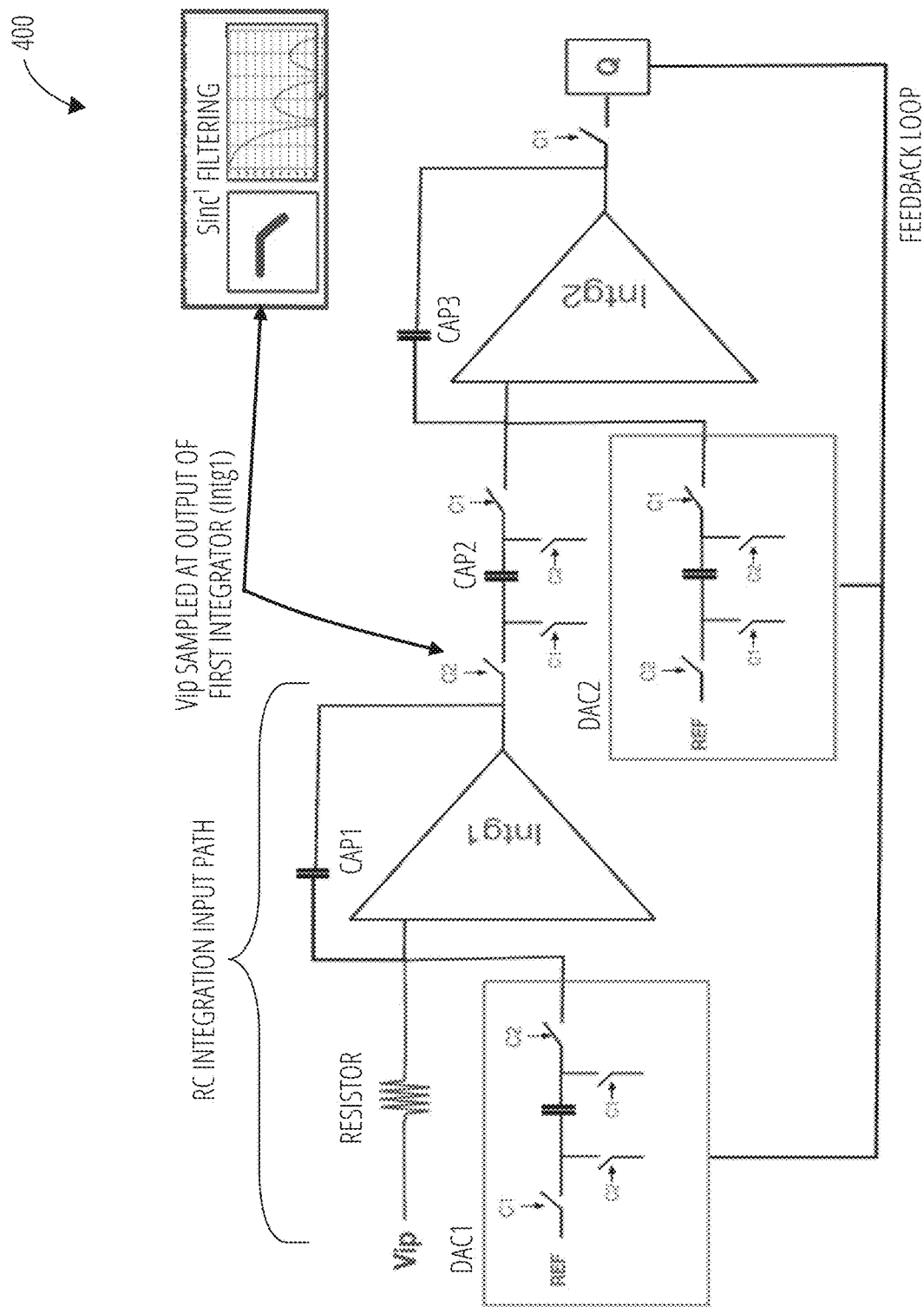
FIG. 4 is a schematic diagram depicting an example DSM, in accordance with various examples discussed herein.

FIG. 4 is a schematic diagram depicting an example DSM 400, in accordance with various examples discussed herein.

First integrator stage INTG1 provides an RC integration input path for an input voltage signal Vip. First integrator stage INTG1 provides first order $SINC^1$ anti-aliasing filtering, though higher order $SINC^L$ filtering where order L is >1 does not exceed the scope of this disclosure and is specifically contemplated. Input voltage signal Vip is sampled at the output of First integrator stage INTG1.

The NTF of DSM 400 characterizes the transfer of noise from where the quantization noise is processed and transferred through the loop to the output of quantizer Q. Since the delta-sigma loop is a switched capacitor circuit, NTF of the DSM is discrete-time, and defined by the ratio of capacitor values for cap2 and cap3. The NTF is not affected by PVT, nor is it affected by sampling rate scaling.

The sampling rate at the output of first integrator INTG1 is set by the switching frequency the sampling switches, which is controlled by the frequency of non-overlapping clock signals C1 and C2. As non-limiting examples, frequencies of non-overlapping clock signals C1 and C2 may be set via a control register.

The multiple integrator stages and feedback loop of DSM 400 operate as a discrete-time loop filter. The loop filter of DSM 400 is discrete time, because processing at second integrator stage INTG2 and quantizer Q is performed in discrete-time.

The output of quantizer Q is fed back to First integrator stage INTG1 and second integrator stage INTG2 via first digital-to-analog-converter DAC1 and second digital-to-analog-converter DAC2, respectively. In the specific non-limiting example depicted by FIG. 4, DAC1 and DAC2 are implemented as switched-capacitor DACs operation of which is controlled by clock signals C1 and C2. More specifically, in the non-limiting example depicted by FIG. 4, DAC1 and DAC4 implement capacitor reuse via capacitor reuse on-chip reference voltage generation, though use of respective charge sampling and charge summing capacitors does not exceed the scope of this disclosure and is specifically contemplated. Switched-capacitor DACs such as DAC1 and DAC2 exhibit immunity to clock jitter.

Figure 5:
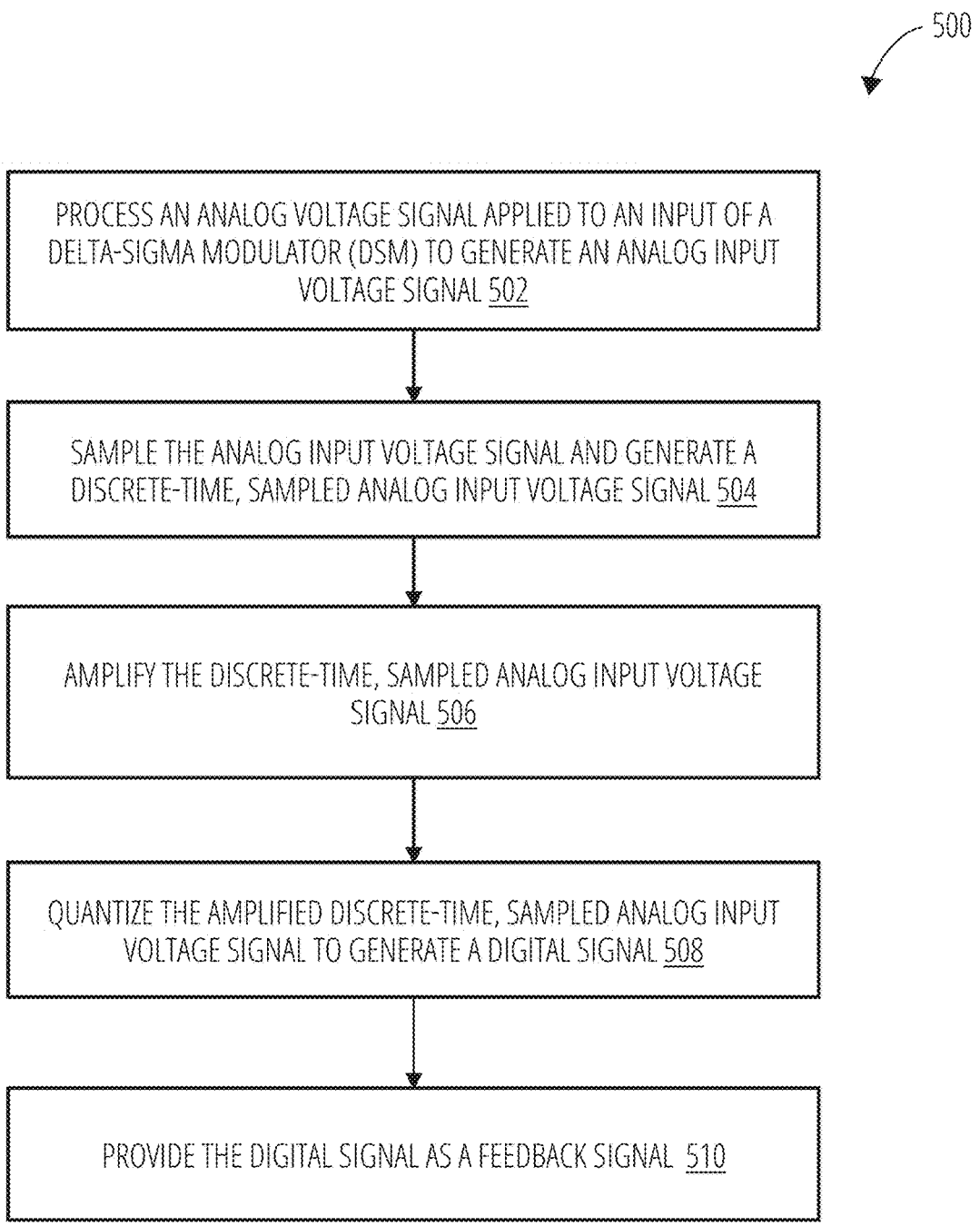
FIG. 5 is a flow diagram depicting a process for delta-sigma analog-to-digital conversion, in accordance with one more examples.

FIG. 5 is a flow diagram depicting a process 500 for delta-sigma modulation or delta-sigma analog-to-digital conversion, in accordance with one more examples. Some or a totality of operations of process 500 may be performed, as a non-limiting example, by DSM 100 or 200.

Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence.

In one or more examples, process 500 includes processing an analog signal applied to an input of a delta-sigma modulator (DSM) to generate an analog input signal at operation 502. The analog signal is processed in continuous-time and the analog input signal is in in continuous-time.

In one or more examples, process 500 includes sampling the analog input voltage signal and generate a discrete-time, sampled analog input voltage signal at operation 504.

In one or more examples, process 500 includes amplifying the discrete-time, sampled analog input voltage signal at operation 506.

In one or more examples, process 500 includes quantizing the amplified discrete-time, sampled analog input voltage signal to generate a digital signal at operation 508.

In one or more examples, process 500 includes providing the digital signal as a feedback signal at operation 510.

The gain of input circuit 202 is a function of the resistance of resistor 204 and capacitance of capacitor 210. Generally speaking, gain may exhibit plus-or-minus 30% variation due to process voltage temperature (PVT) variations that affect one or more of the resistance value of resistor 204 and capacitance value of capacitor 210. One or more examples relate to using a variable resistor for resistor 204 and calibrating gain at input circuit 202 by setting a resistance value of resistor 204.

Figure 6:
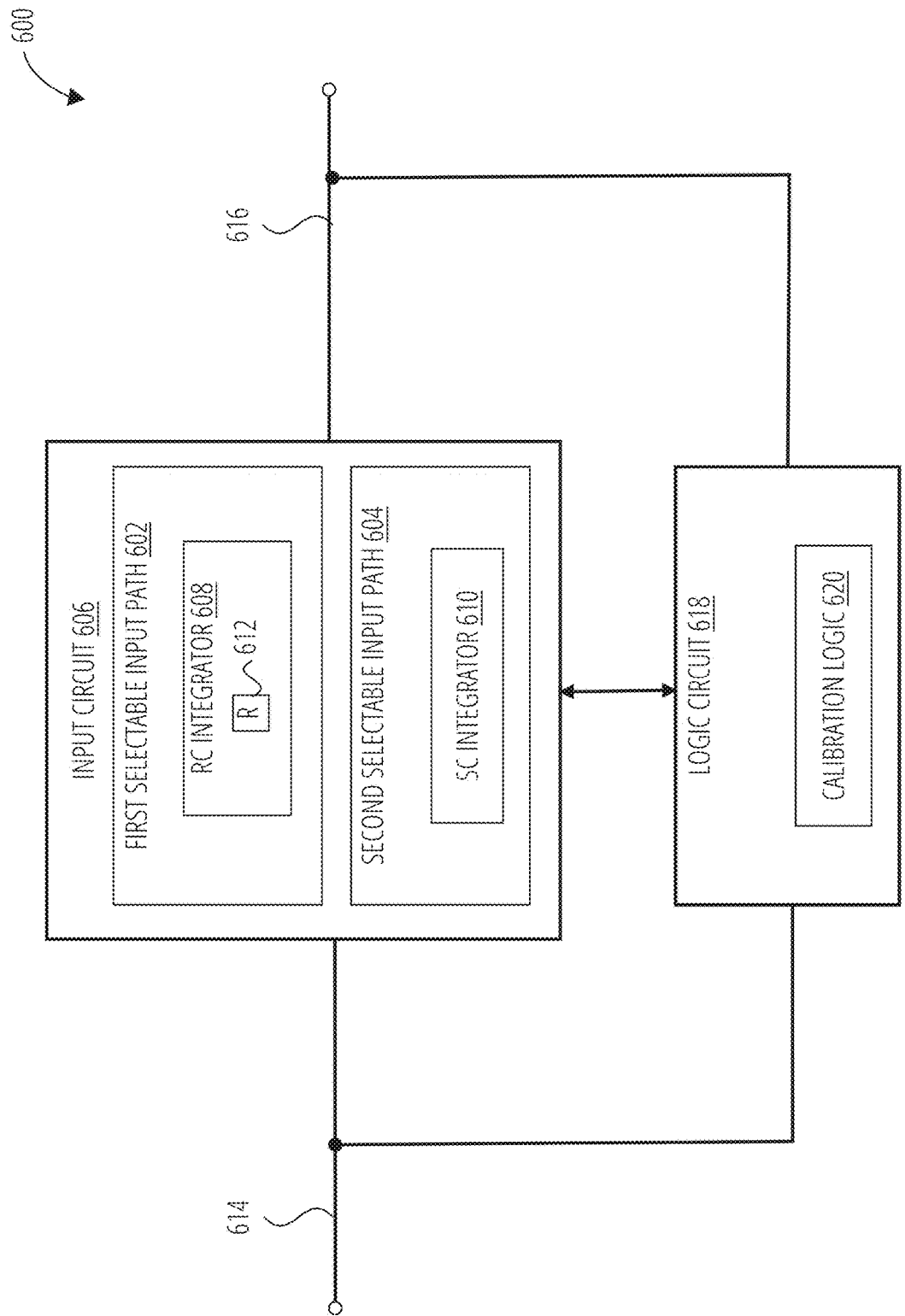
FIG. 6 is a block diagram depicting an apparatus for calibrating gain at a continuous-time input, such as input circuit of FIG. 2, in accordance with one or more examples.

FIG. 6 is a block diagram depicting an apparatus 600 for calibrating gain at a continuous-time input, such as a continuous-time input that includes an input circuit 102 or input circuit 202, in accordance with one or more examples.

Apparatus 600 includes input circuit 606, logic circuit 618, input 614 and output 616. Input circuit 606 includes first selectable input path 602 and second selectable input path 604. First selectable input path 602 includes RC integrator 608, which includes variable resistor 612. Second selectable input path 604 includes SC integrator 610.

Input circuit 606 includes a first selectable input path 602 and a second selectable input path 604, which are respectively selectably enablable by logic circuit 618.

Second selectable input path 604 has a switched-capacitor (SC) integrator 610 ("SC integrator 610"), and the performance of switched capacitors of SC integrator 610 is governed by coefficients that are not affected by PVT variations.

When first selectable input path 602 is disabled and second selectable input path 604 is enabled, the gain of input circuit 606 should not be affected by PVT variations. In a contemplated operation, the gain exhibited by input circuit 606 when the second selectable input path 604 is enabled may be compared to the gain exhibited by input circuit 606 when the first selectable input path 602 to determine a difference or "gain error" value, a resistance value to reduce the gain error may determine and the resistance value R of variable resistor 612 may be set to compensate for, and reduce, the gain error.

Logic circuit 618 includes calibration logic 620 to control a calibration process at apparatus 600 and input circuit 606 more specifically. Logic circuit 618 is coupled to input circuit 606 and may selectively enable/disable first selectable input path 602 and second selectable input path 604.

Logic circuit 618 is coupled with input 614 and output 616 to observe (e.g., measure, without limitation) the gain exhibited by input circuit 606 as the ratio of the input signal to the output signal of input circuit 606. When calibrating the gain of input circuit 606, logic circuit 618 enables one of first selectable input path 602 or second selectable input path 604, disables the other, and obtains measurement values that represent respective voltage levels at input 614 and output 616 during the measurement period. Logic circuit 618 uses the obtained measurement values to calculate a gain value (e.g., as a ratio).

Logic circuit 618 obtains a first gain measurement value representative of the gain of input circuit 606 while SC integrator 610 of second selectable input path 604 is enabled at input circuit 606 and first selectable input path 602 is disabled, and obtain a second gain measurement value representative of the gain of input circuit 606 while RC integrator 608 of first selectable input path 602 is enabled at input circuit 606 and second selectable input path 604 is disabled. Logic circuit 618 calculates the gain error based on a comparison of the first and second gain measurement values, and sets the resistance value R of variable resistor 612 at least partially based on the gain error.

Any suitable technique may be utilized by logic circuit 618 to set the resistance value R of variable resistor 612. As a non-limiting example, the resistance value R may be tuned, where the resistance value R is increased or decreases by a predetermined step size in response to the gain error, until after one or more iterations, the gain error is within a predetermined threshold range. For example, below a predetermined upper threshold that represents an upper limit on gain, and above a predetermined lower threshold that represents a lower limit on the gain. Additionally or alternatively, as a further non-limiting example, the resistance value R may be directly calculated based on the gain error using a function that relates gain error to resistance value. Additionally or alternatively, as a further non-limiting example, a resistance value R may be determined using a look-up-table (LUT) that relates predetermined values of gain error to predetermined values for resistance value R. The LUT can provides a predetermined or interpolated value in response to a gain error input at the LUT.

Figure 7:
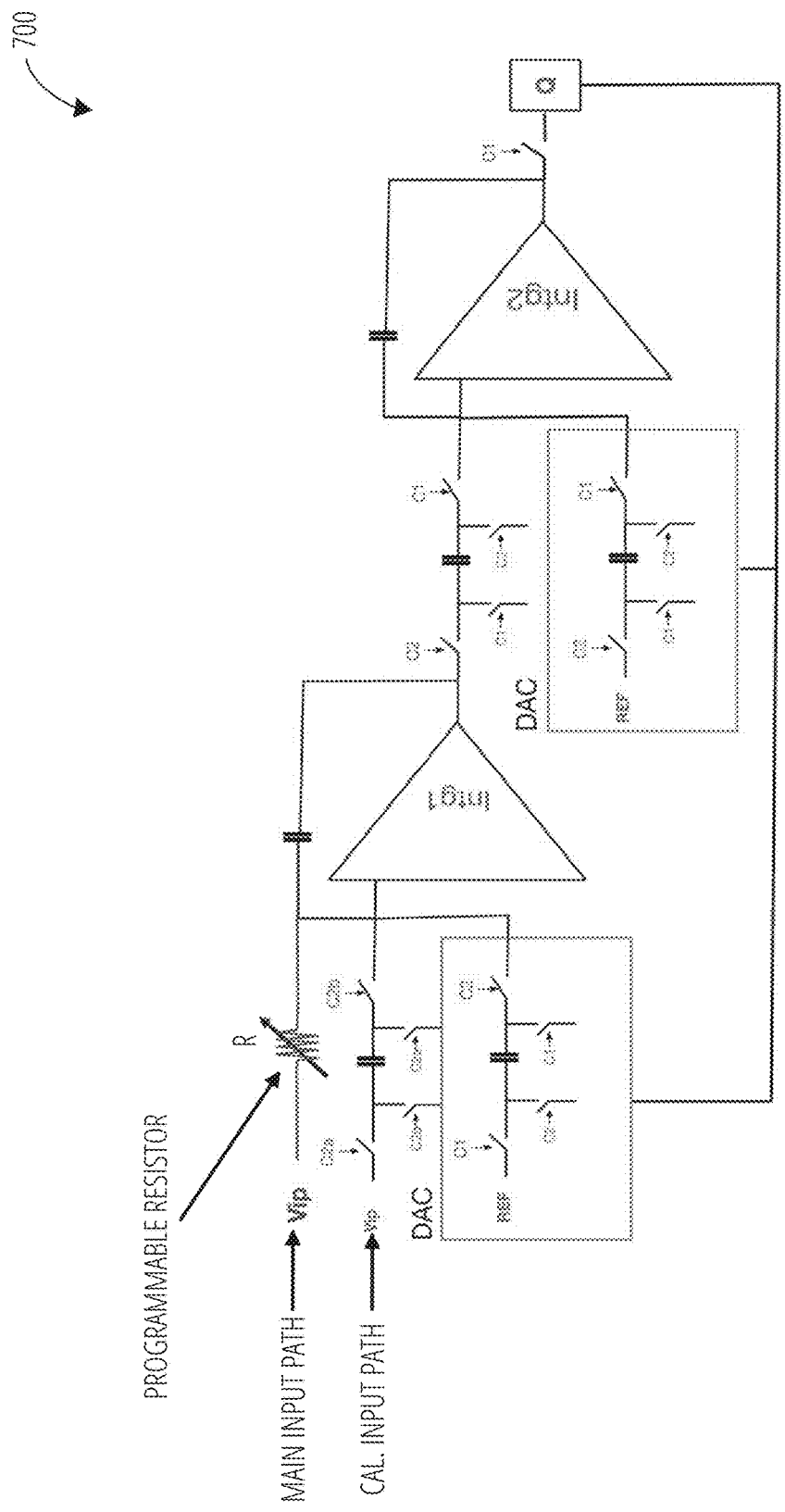
FIG. 7 is a schematic diagram depicting an example DSM in accordance with various examples discussed herein.

FIG. 7 is a schematic diagram depicting an example DSM 700 in accordance with various examples discussed herein. DSM 700 is a specific non-limiting example of a DSM that includes an apparatus for calibrating gain at a continuous-time input such as apparatus 600.

DSM 700 includes a main input path (i.e., a first input path such as a first selectable input path 602) and a calibration ("cal") input path (i.e., a second input path such as a second selectable input path 604). The cal input path is a switched-capacitor integration path while the main input path is an RC integration path. The cal input path can be used for gain tuning and calibration of the RC input path, specifically, by via resistor values R for the programmable resistor.

The input of DSM 700 may be measured via the cal input path and the input processed via the main input path may be once measured. The two measurements may compared, and the resistance value R of the programmable resistor may be set in the main input path to match the gains of the two input paths.

Figure 8:
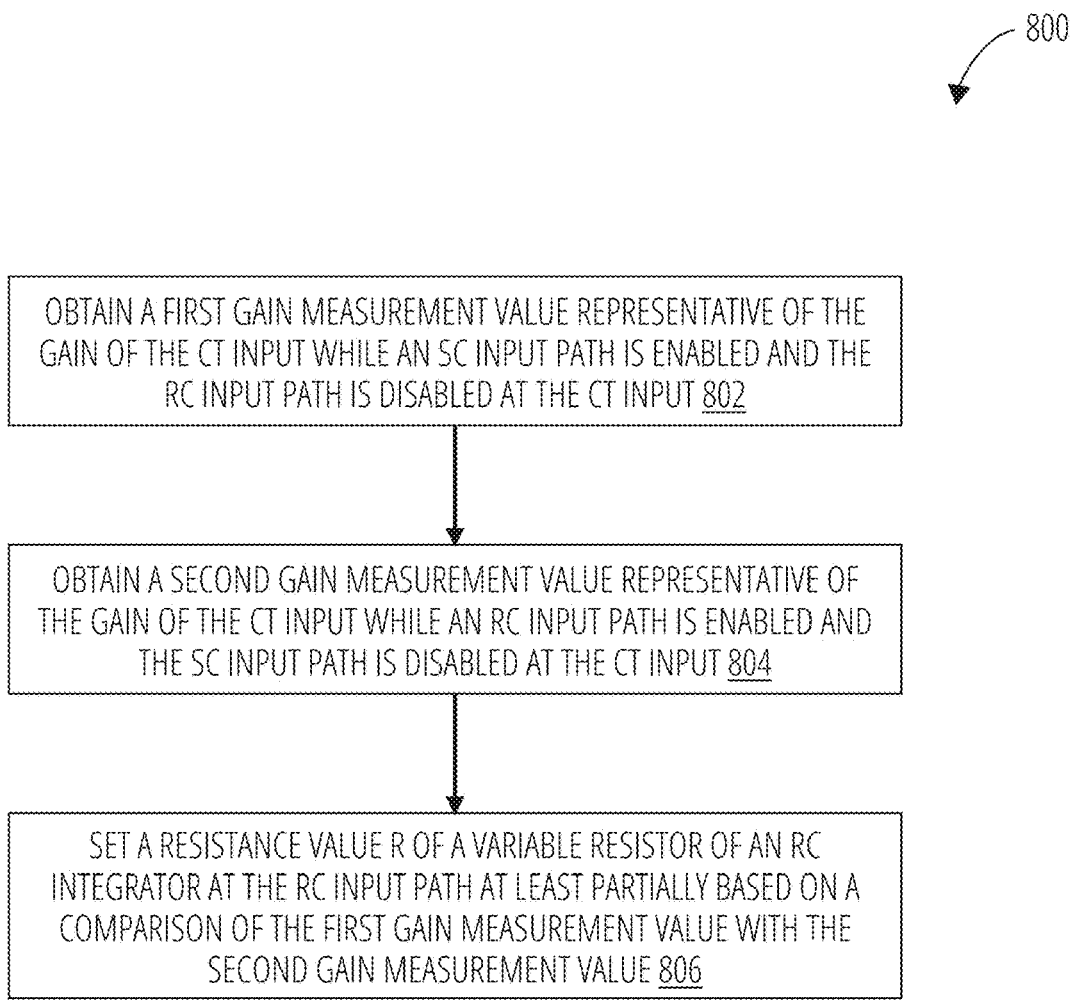
FIG. 8 is a flow diagram depicting a process for calibrating the gain at a continuous-time input, in accordance with one or more examples.

FIG. 8 is a flow diagram depicting a process 800 for calibrating the gain at a continuous-time input circuit, such as input circuit 606, in accordance with one or more examples. Some or a totality of operations of process 800 may be performed, as a non-limiting example, by logic circuit 618 and calibration logic 620.

Although the example process 800 depicts a particular sequence of operations, the sequence may be altered without departing from the scope of the present disclosure. For example, some of the operations depicted may be performed in parallel or in a different sequence that does not materially affect the function of the process 800. In other examples, different components of an example device or system that implements the process 800 may perform functions at substantially the same time or in a specific sequence.

In one or more examples, process 800 includes obtaining a first gain measurement value representative of the gain of the CT input while an SC input path is enabled (second selectable input path 604, without limitation) and the RC input path is disabled (e.g., first selectable input path 602, without limitation) at the CT input at operation 802.

In one or more examples, process 800 includes obtaining a second gain measurement value representative of the gain of the CT input while an RC input path is enabled (e.g., first selectable input path 602, without limitation) and the SC input path is disabled (second selectable input path 604, without limitation) at the CT input at operation 804.

In one or more examples, process 800 includes setting a resistance value r of a variable resistor of an RC integrator at the RC input path at least partially based on a comparison of the first gain measurement value with the second gain measurement value at operation 806.

Figure 9:
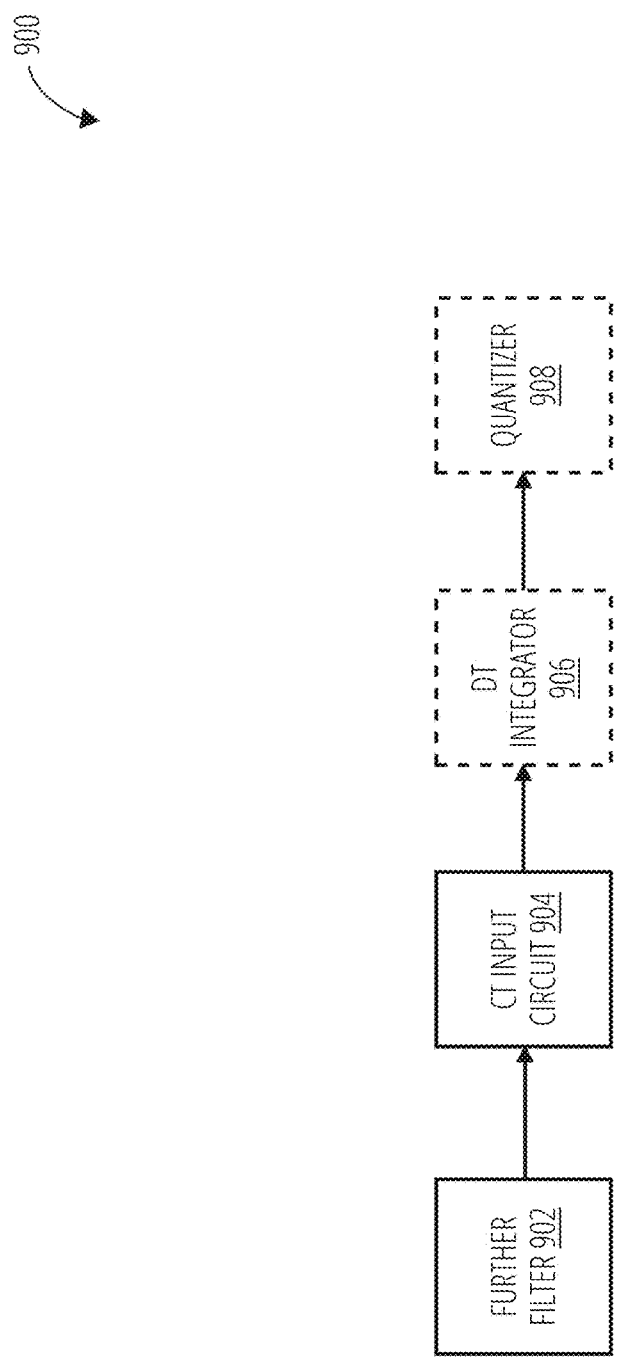
FIG. 9 is a block diagram depicting an apparatus that includes additional filtering in front of an input of a continuous-time input circuit, in accordance with one or more examples.

FIG. 9 is a block diagram depicting an apparatus 900 that includes additional filtering at an input of a continuous-time input, in accordance with one or more examples.

Apparatus 900 includes further filter 902 and CT input circuit 904, and optional DT integrator 906 and quantizer 908. CT input circuit 904 may be, as a non-limiting example, an input circuit 202 or second selectable input path 604. DT integrator 906 may be, as a non-limiting example, an integrator 230.

When apparatus 900 includes further filter 902 and CT input circuit 904, it is a continuous-time input of a DSM with additional filter in front of the continuous-time input. When apparatus 900 includes further filter 902, CT input circuit 904, DT integrator 906, and quantizer 908, it is a DSM that includes further passive filtering in front of the continuous-time input.

As mentioned above, further filter 902 may include any combination of filtering elements (e.g., a passive filter, an active filter, or a combination thereof) for any type of filtering (e.g., low-pass, high-pass, band-pass, or band-stop filtering, without limitation) based at least partially on, as a non-limiting example, specific operating conditions.

Figure 10:
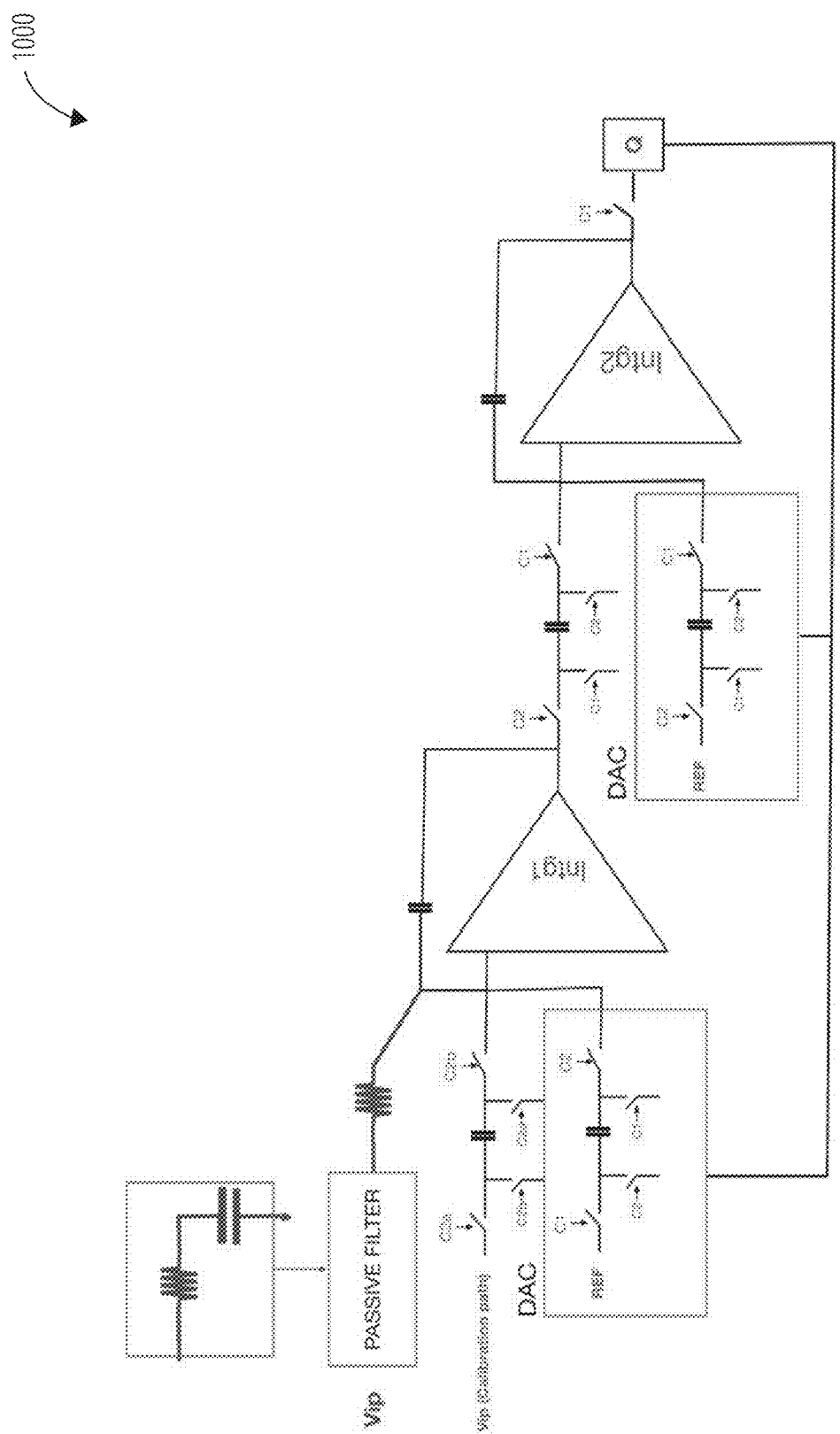
FIG. 10 is a schematic diagram depicting an example apparatus in accordance with various examples discussed herein.

FIG. 10 is a schematic diagram depicting an example apparatus 1000 in accordance with various examples discussed herein. Apparatus 1000 includes a passive filter at the front-end of a RC integration type input path of the DSM. An RC filter is illustrated of the passive filter is illustrated in a box above the passive filter. It may be operative as a low-pass filter, band-pass filter, or high-pass filter, for example, at least partially based on specific operating conditions. Use of active filters as the front-end of the RC integration input path does not exceed the scope of this disclosure and is specifically contemplated. Use of more than one passive or active filter at the front end of the RC integration input path (e.g., cascaded passive filters, active filters, or both passive and active filters, without limitation) does not exceed the scope of this disclosure.

In one or more examples, apparatus 1000 may optionally include a calibration input path similar to the cal input path depicted by FIG. 7. In one or more examples, further filtering at the front-end of the RC integration input path may be disabled or short circuited so that it does not affect the gain.

It may be advantageous to provide higher order DT loop filtering, i.e., include two or more DT loop filters (e.g., integrator 230, without limitation). Higher order DT loop filtering may, as non-limiting examples, further reduce noise and other unwanted signals, resulting in a more accurate DT error signal for the quantizer to operate on than a lower order DT loop filter.

This can help to reduce the noise and other unwanted signals in the system, leading to a higher quality output signal. However, a higher order filter can also introduce more latency and require more processing power to implement, so there is a trade-off between filter performance and system complexity. In some cases, a higher order filter may be necessary to meet the performance requirements of a particular application, while in other cases a simpler filter may be sufficient.

Figure 11:
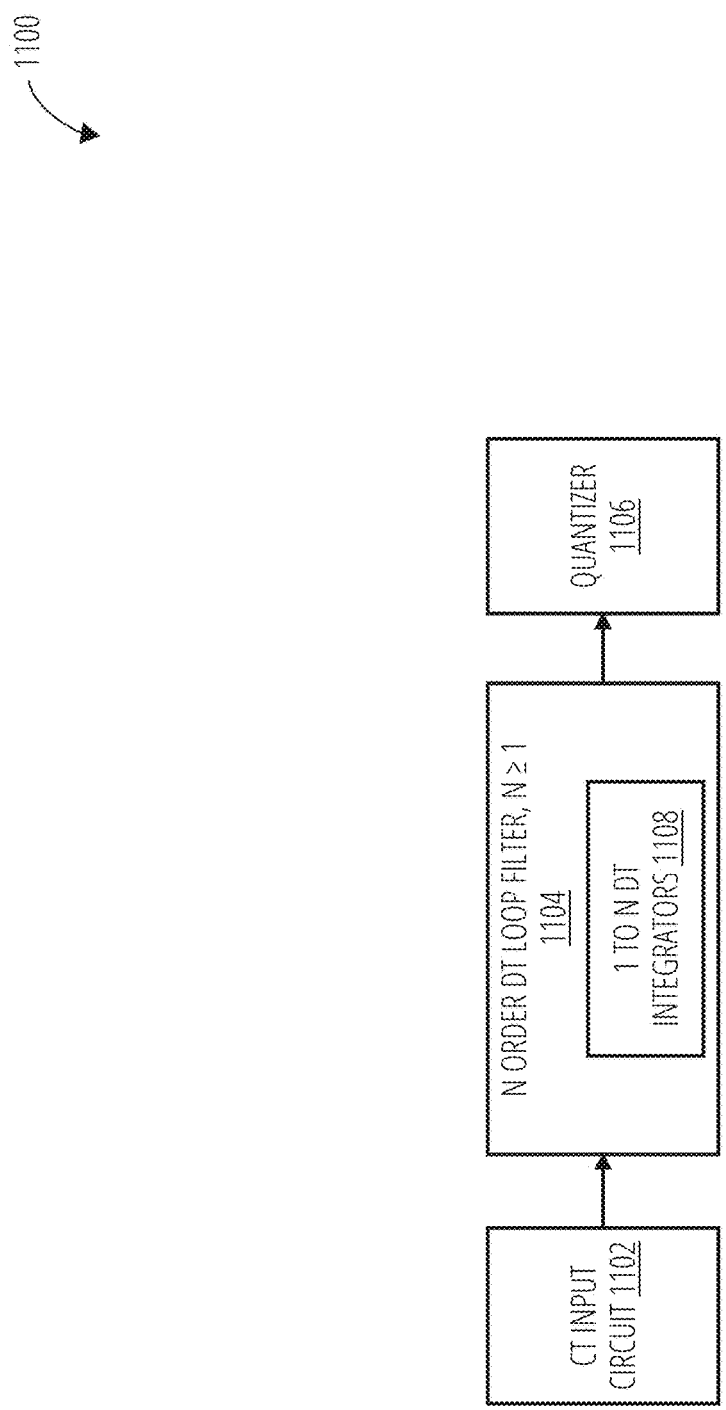
FIG. 11 is a block diagram depicting an apparatus in accordance with one or more examples.

FIG. 11 is a block diagram depicting an apparatus 1100 in accordance with one or more examples.

Apparatus 1100 includes CT input circuit 1102, N order DT loop filter 1104 (where N≥2) and quantizer 1106. N order DT loop filter 1104 includes 1 to N DT integrators 1108 to provide the higher order loop filtering. CT input circuit 1102 may be, as a non-limiting example, input circuit 202, input circuit 606, or CT input circuit 904 with a further filter 902 in front of it. Quantizer 1106 may be, as a non-limiting example, a quantizer 242.

Figure 12:
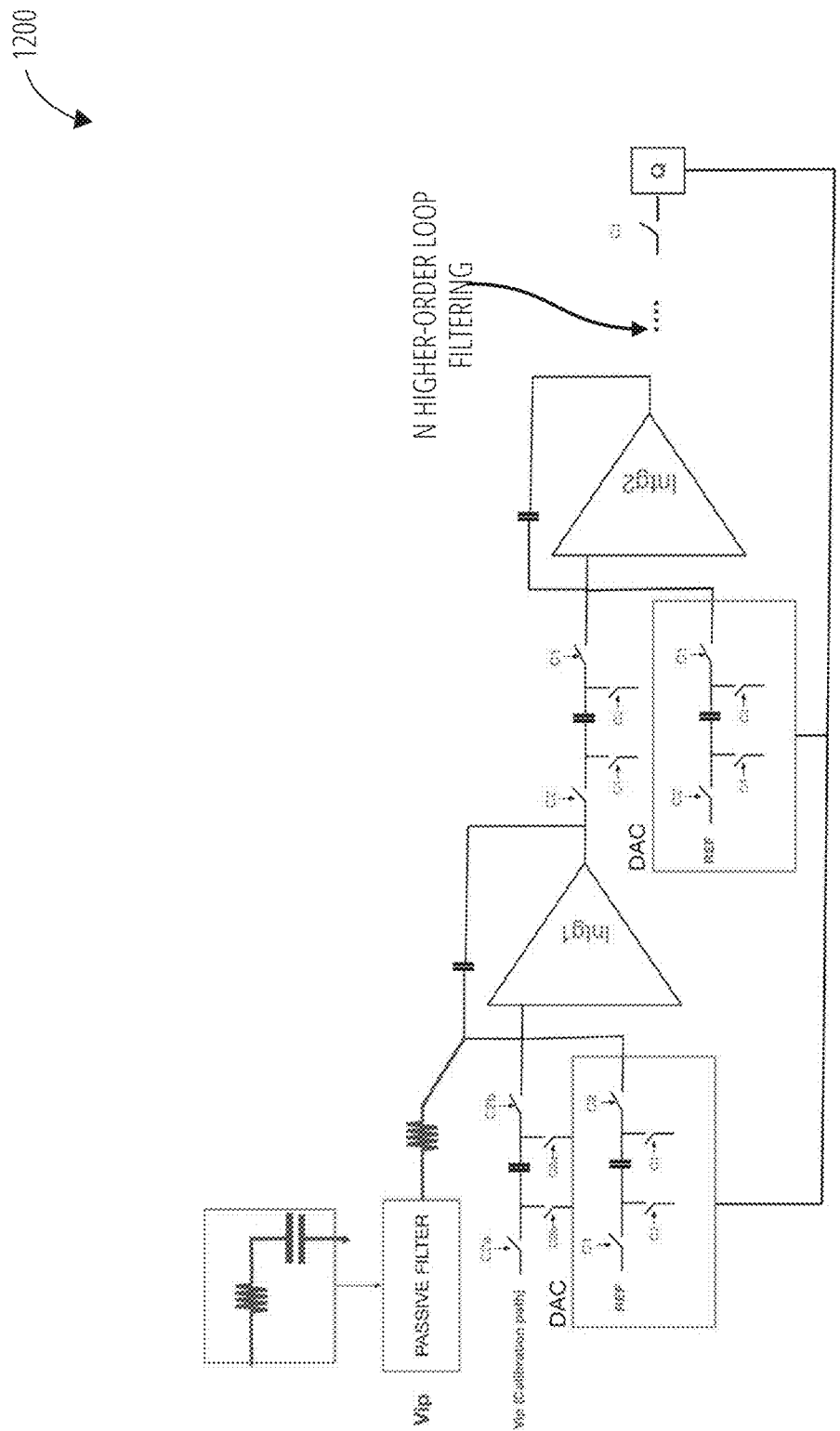
FIG. 12 is a schematic diagram of an example apparatus that includes higher-order loop filtering.

FIG. 12 is a schematic diagram of an example apparatus 1200 that includes higher-order loop filtering, via N further second integrator stage INTG2 stages in series, where N is an integer number≥1 and the total number of second integrator stage INTG2 stages is equal to N+1. Apparatus 1200 may optionally include a calibration input path as discussed above with respect to FIG. 6 and FIG. 7, and, additionally or alternatively, may include an optional further filtering (i.e., passive, active, or a combination of passive or active filtering, without limitation) at a front-end of the RC integration input path as discussed with respect to FIG. 9 and FIG. 10. The number N of second integrator stage INTG2 stages is not limited in any way, and may depend at least partially on, as a non-limiting example, specific operating conditions.

Figure 13:
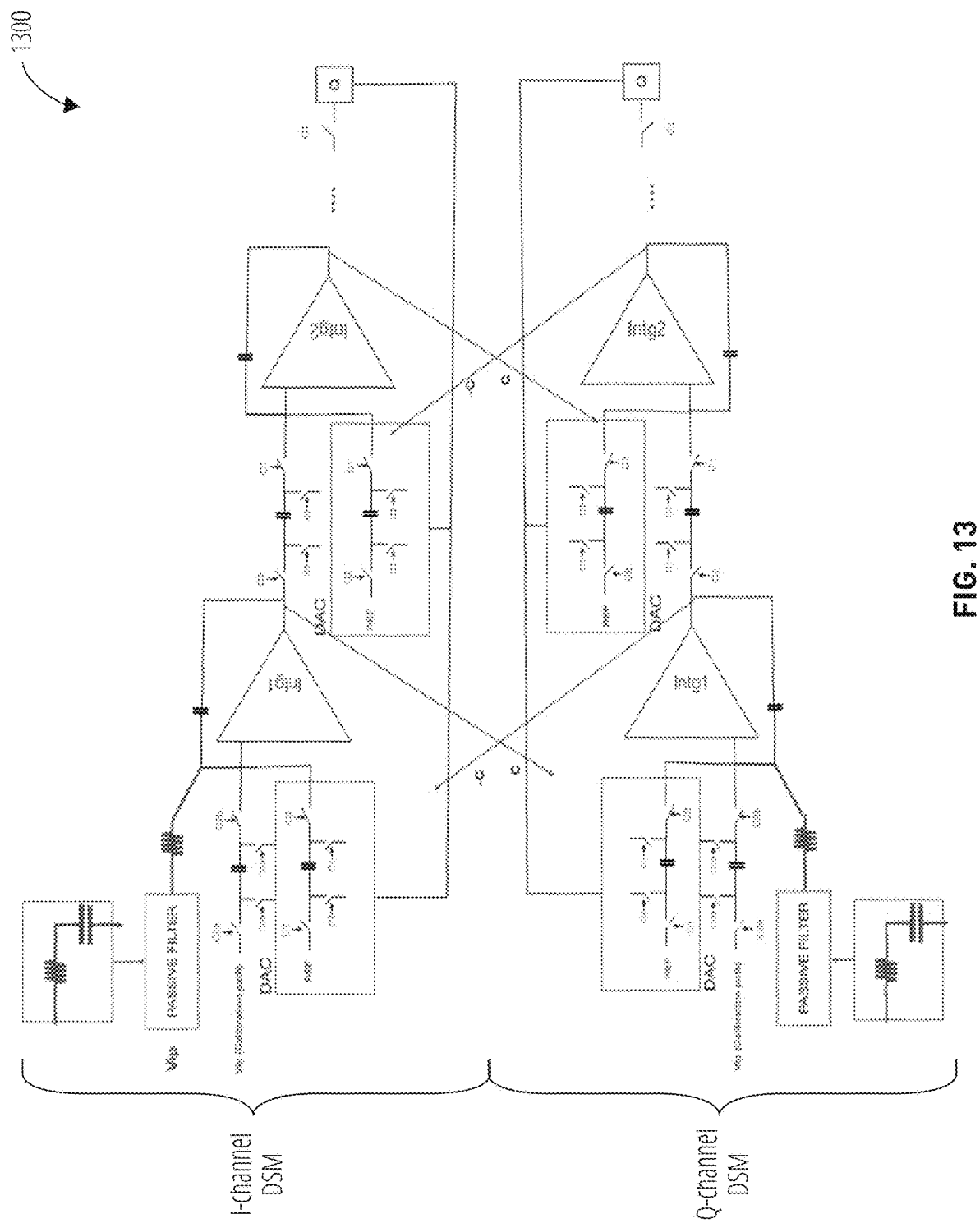
FIG. 13 is a schematic diagram of an example apparatus that includes two DSM cross-coupled to form a quadrature DSM.

FIG. 13 is a schematic diagram of an example apparatus 1300 that includes two DSM cross-coupled to form a quadrature DSM. The quadrature DSM includes an in-phase channel (I-Channel) and a quadrature channel (Q-Channel). Each of the I-Channel and Q-Channel includes a DSM in accordance with any of FIG. 1 through FIG. 12. Respective inputs and outputs of respective integrator stages of the I-Channel DSM and Q-Channel DSM are cross-coupled as depicted in FIG. 13.

One or more of the I-Channel DSM or Q-Channel DSM of apparatus 1300 may optionally include a calibration input path as discussed above with respect to FIG. 6 and FIG. 7. Additionally or alternatively, one or more of the I-Channel DSM or Q-Channel DSM of apparatus 1300 may include an optional further filtering (i.e., passive, active, or a combination of passive or active filtering, without limitation) at a front-end of the RC integration input path as discussed with respect to FIG. 9 and FIG. 10. Additionally or alternatively, one or more of the I-Channel DSM or Q-Channel DSM of apparatus 1300 may optionally include N further second integration INTG2 stages as discussed with respect to FIG. 12. A number N of second integrator stage INTG2 stages is not limited in any way, and may depend at least partially on, as a non-limiting example, specific operating conditions.

Figure 14:
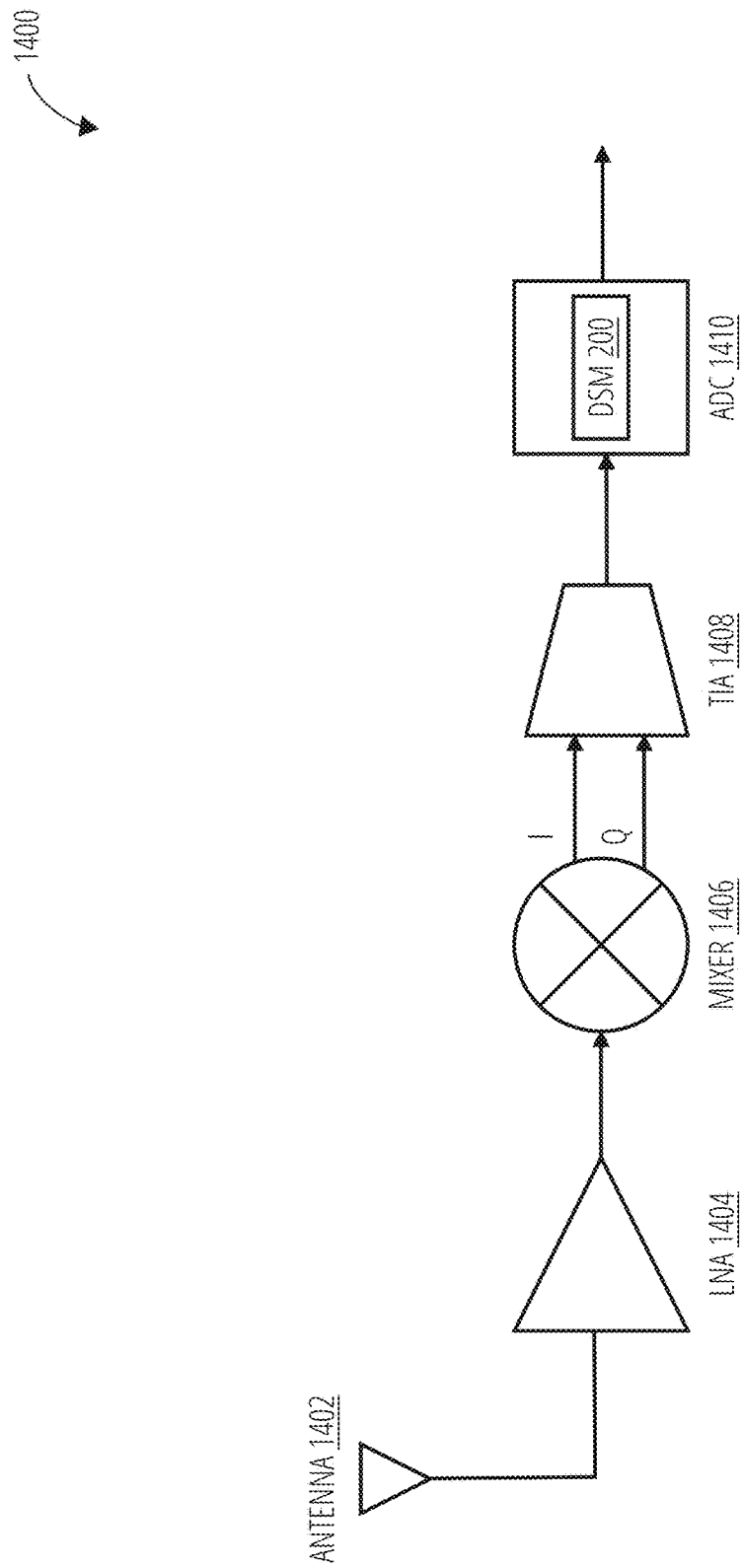
FIG. 14 is a block diagram depicting a wireless receiver that includes an ADC that uses DSM in accordance with one or more examples.

FIG. 14 is a block diagram depicting a wireless receiver 1400 that includes an ADC that uses DSM in accordance with one or more examples.

The wireless receiver 1400 comprises an antenna 1402, an LNA 1404, a mixer 1406, a TIA 1408, and an ADC 1410.

Antenna 1402 receives a wireless signal from the air and converts it into an electrical signal, e.g., an analog voltage signal. Antenna 1402 captures electromagnetic waves in the air and converts them into an electrical voltages. When the electromagnetic waves in the air correspond to a wireless signal, the electrical voltages generated by antenna 1402 are an electrical voltage signal.

Low-Noise Amplifier (LNA) 1404 ("LNA 1404") amplifies the weak electrical signal received from antenna 1402 while adding limited noise to the signal. Amplifying the received signal early in the receiver chain improves the signal-to-noise ratio (SNR) of the received signal.

Mixer 1406 down converts the frequency of the received signal to a lower frequency for further processing. Mixer 1406 is a non-linear device that takes the amplified signal from LNA 1404 and mixes it with a local oscillator (LO) signal to produce an intermediate frequency (IF) current signal that is a lower frequency than the received signal.

Trans-Impedance Amplifier (TIA) 1408 ("TIA 1408") converts the IF current signal from the mixer into an IF voltage signal that can be digitized by ADC 1410. The TIA may also provide some additional amplification to the received signal and filters out noise.

Analog-to-Digital Converter (ADC) 1410 ("ADC 1410") converts the analog voltage signal from the TIA into a digital signal that can be further processed by digital signal processing (DSP) algorithms. The DSM 200 of ADC 1410 enables ADC 1410 to perform some filtering of the analog voltage signal in the front-end, which may eliminates the need for a baseband amplifier (BBamp) for such filtering. In one or more examples, wireless receiver 1400 may include a BBamp and the BBamp may optionally be selectively bypassed. In one or more examples, ADC 1410 may, additionally or alternatively to DSM 200, may include DSM 400, DSM 700, DSM 1000, DSM 1200, or DSM 1300.

Figure 15:
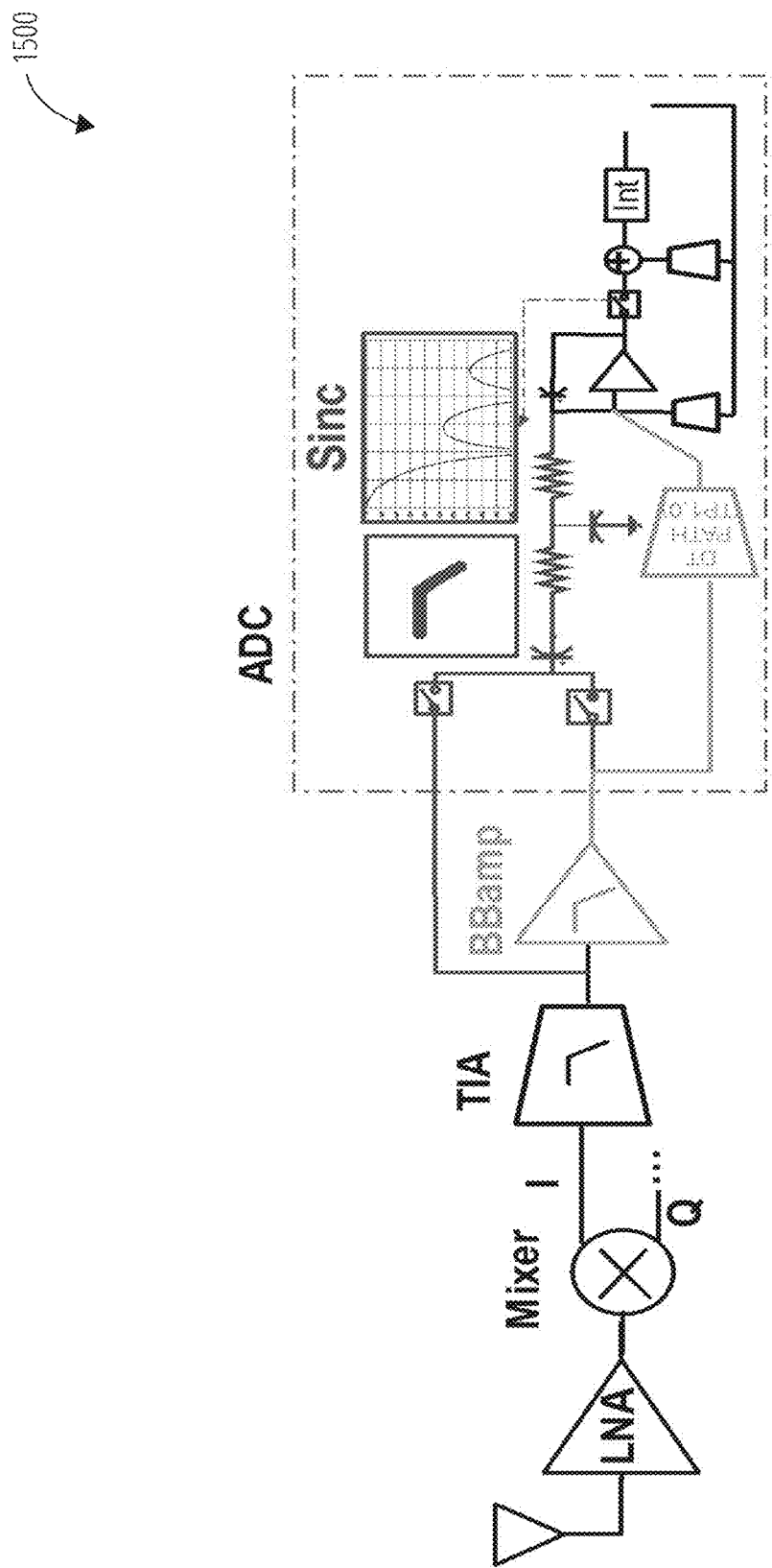
FIG. 15 is a block diagram depicting an example wireless receiver.

FIG. 15 is a block diagram depicting an example wireless receiver 1500, and more specifically, a direct-conversion Bluetooth Low Energy (BLE) receiver that includes any one of a DSM 100, DSM 200, DSM 400, DSM 700, DSM 1000, DSM 1200, or DSM 1300 to implement the ADC block. The ADC block provides anti-aliasing filtering and gain and may optionally selectively bypass a Base-Band amplifier (BB-AMP) and DT PATH TP1.0.

Figure 16:
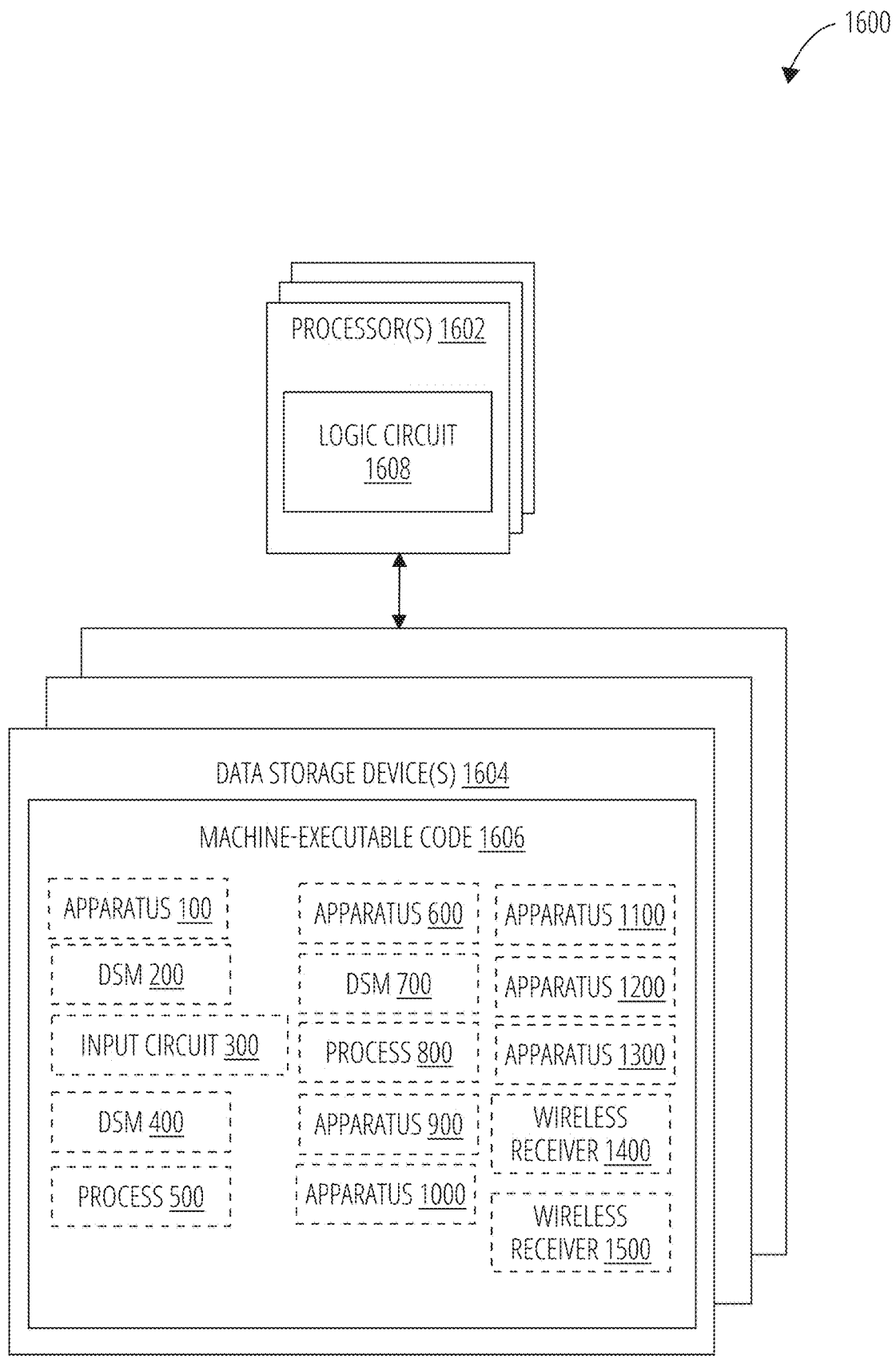
FIG. 16 is a block diagram of a circuitry that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 16 illustrates non-limiting examples of implementations of functional elements disclosed herein. In some examples, some or all portions of the functional elements disclosed herein may be performed by hardware capable of carrying out the functional elements.

FIG. 16 is a block diagram of a circuitry 1600 that, in some examples, may be used to implement various functions, operations, acts, processes, or methods disclosed herein. The circuitry 1600 includes one or more processors 1602 (sometimes referred to herein as "processors 1602") operably coupled to one or more data storage devices 1604 (sometimes referred to herein as "storage 1604"). The storage 1604 includes machine-executable code 1606 stored thereon and the processors 1602 include logic circuit 1608. The machine-executable code 1606 information describing functional elements that may be implemented by (e.g., performed by) the logic circuit 1608. The logic circuit 1608 is adapted to implement (e.g., perform) the functional elements described by the machine-executable code 1606. The circuitry 1600, when executing the functional elements described by the machine-executable code 1606, should be considered as special purpose hardware for carrying out functional elements disclosed herein. In some examples, the processors 1602 may perform the functional elements described by the machine-executable code 1606 sequentially, concurrently (e.g., on one or more different hardware platforms), or in one or more parallel process streams.

When implemented by logic circuit 1608 of the processors 1602, the machine-executable code 1606 adapts the processors 1602 to perform operations of examples disclosed herein. By way of non-limiting example, the machine-executable code 1606 may adapt the processors 1602 to perform some or a totality of operations of one or more of: process 500 or process 800.

Also by way of non-limiting example, the machine-executable code 1606 may adapt the processors 1602 to perform some or a totality of features, functions, or operations disclosed herein for one or more of: apparatus 100, DSM 200, input circuit 300, DSM 400, apparatus 600, DSM 700, apparatus 900, apparatus 1000, apparatus 1100, apparatus 1200, apparatus 1300, wireless receiver 1400, or wireless receiver 1500. More specifically, features, functions, or operations disclosed herein for one or more of: input circuit 202, switched capacitor 216, integrator 230, sampling switch 240 and quantizer 242, resistor 204, current summing node 206, op-amp 208, capacitor 210, DAC 212, switch 218, capacitor 220, switch 222, switch 224, switch 226, current summing node 232, capacitor 234, op-amp 236, or DAC 238; input circuit 606, logic circuit 618, input 614, output 616, first selectable input path 602, second selectable input path 604, RC integrator 608, variable resistor 612, SC integrator 610; further filter 902, CT input circuit 904, optional DT integrator 906, and quantizer 908; CT input circuit 1102, N order DT loop filter 1104 (where N≥2), or quantizer 1106; or antenna 1402, LNA 1404, mixer 1406, TIA 1408, or ADC 1410.

The processors 1602 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes functional elements corresponding to the machine-executable code 1606 (e.g., software code, firmware code, hardware descriptions) related to examples of the present disclosure. It is noted that a general-purpose processor (may also be referred to herein as a host processor or simply a host) may be a microprocessor, but in the alternative, the processors 1602 may include any conventional processor, controller, microcontroller, or state machine. The processors 1602 may also be implemented as a combination of computing devices, such as a combination of a DSP and a microprocessor, a plurality of microprocessors, one or more microprocessors in conjunction with a DSP core, or any other such configuration.

In some examples, the storage 1604 includes volatile data storage (e.g., random-access memory (RAM)), non-volatile data storage (e.g., Flash memory, a hard disc drive, a solid state drive, erasable programmable read-only memory (EPROM), without limitation). In some examples, the processors 1602 and the storage 1604 may be implemented into a single device (e.g., a semiconductor device product, a system on chip (SOC), without limitation). In some examples, the processors 1602 and the storage 1604 may be implemented into separate devices.

In some examples, the machine-executable code 1606 may include computer-readable instructions (e.g., software code, firmware code). By way of non-limiting example, the computer-readable instructions may be stored by the storage 1604, accessed directly by the processors 1602, and executed by the processors 1602 using at least the logic circuit 1608. Also by way of non-limiting example, the computer-readable instructions may be stored on the storage 1604, transferred to a memory device (not shown) for execution, and executed by the processors 1602 using at least the logic circuit 1608. Accordingly, in some examples, the logic circuit 1608 includes electrically configurable logic circuit 1608.

In some examples, the machine-executable code 1606 may describe hardware (e.g., circuitry) to be implemented in the logic circuit 1608 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG®, SYSTEMVERILOG™, or very large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1608 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples, the machine-executable code 1606 may include an HDL, an RTL, a GL description, a mask level description, other hardware description, or any combination thereof.

In examples where the machine-executable code 1606 includes a hardware description (at any level of abstraction), a system (not shown, but including the storage 1604) implements the hardware description described by the machine-executable code 1606. By way of non-limiting example, the processors 1602 may include a programmable logic device (e.g., an FPGA or a PLC), and the logic circuit 1608 may be electrically controlled to implement circuitry corresponding to the hardware description into the logic circuit 1608. Also by way of non-limiting example, the logic circuit 1608 may include hard-wired logic manufactured by a manufacturing system (not shown, but including the storage 1604) according to the hardware description of the machine-executable code 1606.

Regardless of whether the machine-executable code 1606 includes computer-readable instructions or a hardware description, the logic circuit 1608 is adapted to perform the functional elements described by the machine-executable code 1606 when implementing the functional elements of the machine-executable code 1606. It is noted that although a hardware description may not directly describe functional elements, a hardware description indirectly describes functional elements that the hardware elements described by the hardware description are capable of performing.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B." As used herein, "each" means some or a totality. As used herein, "each and every" means a totality.

Any characterization in this description of something as "typical," "conventional," "known," or the like does not necessarily mean that it is disclosed in the prior art or that the discussed aspects are appreciated in the prior art. Nor does it necessarily mean that, in the relevant field, it is widely known, well-understood, or routinely used. Such characterizations should be understood to mean "known to the inventor(s) of this disclosure."

Additional non-limiting examples include:

Example 1: An apparatus, comprising: an input circuit to receive an analog signal and produce an analog input signal, the input circuit comprising a resistor-capacitor (RC) integrator; a switched-capacitor to sample the analog input signal and produce a discrete-time, sampled input signal; an integrator to process the discrete-time, sampled input signal; a quantizer to convert an output of the integrator to a digital signal; and a feedback loop to provide the digital signal to respective inputs of the RC integrator and the integrator.

Example 2: The apparatus according to Example 1, wherein a signal transfer function of the apparatus is continuous-time and a noise transfer function of the apparatus is discrete-time.

Example 3: The apparatus according to Examples 1 and 2, wherein the RC integrator comprises: a resistor; an op-amp; and a capacitor coupling an output of the op-amp with an input of the op-amp.

Example 4: The apparatus according to Examples 1 to 3, comprising: a current summing node, wherein the resistor, the capacitor, the inverting input of the op-amp, and the feedback loop are all coupled to the current summing node.

Example 5: The apparatus according to Examples 1 to 4, wherein the feedback loop comprises: a first digital-to-analog converter in a signal path to a respective input of the RC integrator; and a second digital-to-analog converter in a respective signal path to a respective input of the integrator.

Example 6: The apparatus according to Examples 1 to 5, wherein the integrator to process the discrete-time, sampled input signal comprises an integrating op-amp to integrate the discrete-time, sampled input signal.

Example 7: The apparatus according to Examples 1 to 6, wherein the resistor-capacitor (RC) integrator to low-pass filter and noise-shape the analog signal.

Example 8: The apparatus according to Examples 1 to 7, wherein the RC integrator includes a capacitor coupled to pass low-frequency signals from the input of the RC integrator to the output of the RC integrator and to attenuate high-frequency noise.

Example 9: The apparatus according to Examples 1 to 8, wherein a resistor of the RC integrator to convert the analog signal from a voltage signal to a current signal.

Example 10: The apparatus according to Examples 1 to 9, comprising: a further filter coupled in-front of the input circuit.

Example 11: The apparatus according to Examples 1 to 10, wherein the input circuit comprises a first selectable input path and a second selectable input path, wherein the first selectable input path includes the RC integrator, wherein the second selectable input path includes a switched-capacitor (SC) integrator.

Example 12: The apparatus according to Examples 1 to 11, comprising a logic circuit to: obtain a first gain measurement value representative of the gain of the input circuit while the second input path is enabled at the input circuit and the first input path is disabled at the input circuit; obtain a second gain measurement value representative of the gain of the input circuit while the first input path is enabled at the input circuit and the second input path is disabled at the input circuit; and set a resistance value R of a variable resistor of the RC integrator of the first input path at least partially based on a comparison of the first gain measurement value with the second gain measurement value.

Example 13: A method, comprising: processing an analog voltage signal applied to an input of a delta-sigma modulator (DSM) to generate an analog input voltage signal; sampling the analog input voltage signal to generate a discrete-time, sampled analog input voltage signal; amplifying the discrete-time, sampled analog input voltage signal; quantizing the amplified discrete-time, sampled analog input voltage signal to generate a digital signal; and providing the digital signal as a feedback signal.

Example 14: The method according to Example 13, wherein processing the analog voltage signal applied to the input of the DSM to generate the analog input voltage signal comprises: resistor-capacitor integrating the analog voltage signal.

Example 15: The method according to Examples 13 and 14, comprising: processing an analog voltage signal in continuous-time.

Example 16: An apparatus, comprising: a first terminal to receive an analog signal; a second terminal to provide a digital signal representative of the analog signal; and a delta-sigma modulator coupled between the first terminal and the second terminal, wherein the delta-sigma modulator exhibits a continuous-time signal transfer function and a discrete-time noise transfer function.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
   an input circuit to receive an analog signal and produce an analog input signal, the input circuit comprising a resistor-capacitor (RC) integrator;
   a switched-capacitor to sample the analog input signal and produce a discrete-time, sampled input signal;
   an integrator to process the discrete-time, sampled input signal;
   a quantizer to convert an output of the integrator to a digital signal; and
   a feedback loop to provide the digital signal to respective inputs of the RC integrator and the integrator.

2. The apparatus of claim 1, wherein a signal transfer function of the apparatus is continuous-time and a noise transfer function of the apparatus is discrete-time.

3. The apparatus of claim 1, wherein the RC integrator comprises:
   a resistor;
   an op-amp; and
   a capacitor coupling an output of the op-amp with an input of the op-amp.

4. The apparatus of claim 3, comprising:
   a current summing node,
   wherein the resistor, the capacitor, the inverting input of the op-amp, and the feedback loop are all coupled to the current summing node.

5. The apparatus of claim 1, wherein the feedback loop comprises:
   a first digital-to-analog converter in a signal path to a respective input of the RC integrator; and
   a second digital-to-analog converter in a respective signal path to a respective input of the integrator.

6. The apparatus of claim 1, wherein the integrator to process the discrete-time, sampled input signal comprises an integrating op-amp to integrate the discrete-time, sampled input signal.

7. The apparatus of claim 1, wherein the resistor-capacitor (RC) integrator to low-pass filter and noise-shape the analog signal.

8. The apparatus of claim 7, wherein the RC integrator includes a capacitor coupled to pass low-frequency signals from the input of the RC integrator to the output of the RC integrator and to attenuate high-frequency noise.

9. The apparatus of claim 1, wherein a resistor of the RC integrator to convert the analog signal from a voltage signal to a current signal.

10. The apparatus of claim 1, comprising:
    a further filter coupled in-front of the input circuit.

11. The apparatus of claim 1, wherein the input circuit comprises a first selectable input path and a second selectable input path, wherein the first selectable input path includes the RC integrator, wherein the second selectable input path includes a switched-capacitor (SC) integrator.

12. The apparatus of claim 11, comprising a logic circuit to:
    obtain a first gain measurement value representative of the gain of the input circuit while the second input path is enabled at the input circuit and the first input path is disabled at the input circuit;
    obtain a second gain measurement value representative of the gain of the input circuit while the first input path is enabled at the input circuit and the second input path is disabled at the input circuit; and
    set a resistance value R of a variable resistor of the RC integrator of the first input path at least partially based on a comparison of the first gain measurement value with the second gain measurement value.

13. A method, comprising:
    processing, in a first order loop, an analog voltage signal applied to an input of a delta-sigma modulator (DSM) to generate an analog input voltage signal;
    sampling the analog input voltage signal to generate a discrete-time, sampled analog input voltage signal;
    integrating and amplifying, in a second order loop, the discrete-time, sampled analog input voltage signal;
    quantizing, in the second order loop, the integrated and amplified discrete-time, sampled analog input voltage signal to generate a digital signal; and
    providing the digital signal as a feedback signal to the first order loop and the second order loop.

14. The method of claim 13, wherein processing the analog voltage signal applied to the input of the DSM to generate the analog input voltage signal comprises:
    resistor-capacitor integrating the analog voltage signal.

15. The method of claim 13, comprising: processing an analog voltage signal in continuous-time.

16. An apparatus, comprising:
    a first terminal to receive an analog signal;
    a second terminal to provide a digital signal representative of the analog signal; and
    a delta-sigma modulator coupled between the first terminal and the second terminal,
    wherein the delta-sigma modulator exhibits a continuous-time signal transfer function and a discrete-time noise transfer function,
    wherein a signal-transfer path from the first terminal to an input of a quantizer is implemented exclusively in continuous time by a resistor-capacitor integrator, and a noise-transfer path from an output of the quantizer back to an input of the resistor-capacitor integrator is implemented exclusively in discrete time by a switched-capacitor loop filter.

* * * * *